United States Patent [19]

Hori

[11] Patent Number: 4,853,892

[45] Date of Patent: Aug. 1, 1989

[54] ASSOCIATIVE MEMORY DEVICE INCLUDING WRITE INHIBIT CIRCUITRY

[75] Inventor: Chikahiro Hori, Kanagawa, Japan

[73] Assignee: Kabushiki Kaisha Toshiba, Kawasaki, Japan

[21] Appl. No.: 4,004

[22] Filed: Jan. 16, 1987

[30] Foreign Application Priority Data

Jan. 17, 1986 [JP] Japan .................................. 61-6382

[51] Int. Cl.$^4$ .......................................... G11C 15/00
[52] U.S. Cl. ..................................... 365/49; 365/195; 365/189.08
[58] Field of Search ......................... 365/49, 195, 189; 364/200 MS File, 900 MS File

[56] References Cited

U.S. PATENT DOCUMENTS

| 4,090,258 | 5/1978 | Cricchi | 365/195 |
| 4,646,271 | 2/1987 | Uchiyama et al. | 365/49 |
| 4,670,858 | 6/1987 | Almy | 365/49 |
| 4,740,917 | 4/1988 | Denis et al. | 365/49 |

FOREIGN PATENT DOCUMENTS 0074889 5/1982 Japan ...................................... 365/49
0040396 3/1984 Japan ...................................... 365/49

OTHER PUBLICATIONS

H. Kodata et al., "An 8Kb Content-Addressable and Reentrant Memory", IEEE ISSCC Digest of Technical Papers, Feb. 13, 1985, pp. 42–43.

Primary Examiner—Stuart N. Hecker
Assistant Examiner—Glenn A. Gossage
Attorney, Agent, or Firm—Foley & Lardner, Schwartz, Jeffery, Schwaab, Mack, Blumenthal & Evans

[57] ABSTRACT

An associative memory device in which a detection or determination is made if the same information as that to be written in the associative memory cells has been stored therein before storing the information to be written in the memory cells, and if the result of the detection is that the same information has been stored therein, the information to be written is inhibited from being stored while when the same information has not been stored therein, the information to be written is permitted to be stored in a predetermined memory cell, so as not to store the same information into a plurality of different addresses of the memory cells.

4 Claims, 3 Drawing Sheets

ASSOCIATIVE MEMORY DEVICE INCLUDING WRITE INHIBIT CIRCUITRY

BACKGROUND OF THE INVENTION (1) Field of the Invention

The present invention relates to an associative memory device capable of determining by the contents of information, addresses into which the information has been stored to prevent the same information from being stored in different addresses of the associative memory device as well as capable of performing high speed access to the information.

(2) Description of the Prior Art

In recent computers, there is a tendency that high speed operation of the computers is required in order to improve the processing capability, and this in turn necessitates a high speed operation of memories, as well. To this end, high speed cache memories are being widely used as an auxiliary memory of a main memory although they have a smaller memory capacity respectively compared with the main memory having a large capacity but a low speed operation.

Since only information which is frequently used is stored in this cache memory, when a processor has access to the main memory, the information thus accessed is to be stored in the cache memory at random. It is therefore necessary to determine in which address among addresses of the cache memory the information demanded by the processor is being stored and to obtain access thereto.

In processing these cache memories, there is used, for instance, an associative memory wherein an address in which particular information has been stored, can be known from the contents of the memory. It is constructed in such a manner that addresses of the cache memory are related to the addresses of the associative memory (having the same memory capacity as that of the cache memory) where the information has been stored, and the addresses of the information in the cache memory are stored into the addresses of the associative memory which correspond to those of the cache memory.

With this construction, the associative memory is accessed by each of the addresses of the main memory where the information has been stored, i.e., by the information to be stored in the associative memory in order to obtain necessary information for the processor. In this case, when it is found that the information has been stored in the associative memory, a particular address in the associative memory can be determined by the associative memory function. As a result, when access to the cache memory is carried out by the address thus determined, the information necessary for the processor can be obtained from the cache memory at high speed.

However, there are often such cases that the same information might be stored in different addresses in the associative memory. Consequently, when retrieval operation of the information stored in the different addresses is carried out in this case, a plurality of addresses corresponding to the same information are to be produced. Therefore, when such a case as described above occurs in the associative memory used in the processing of the cache memory, it becomes no longer possible to access the cache memory.

In order to prevent the drawbacks or disadvantages described above, when a plurality of occurrences of the same information are determined by detecting the output information in the reading-out of the information from, for instance, the associative memory, it becomes necessary to stop the subsequent operation or to take some measures for producing the selected information in accordance with a predetermined priority order preliminarily set up. As a result, it also becomes necessary to provide a specific means for that operation as well as resulting in a problem that a high speed performance of the cache memory is lowered by the operation time necessary to provide a specific means for that operation as well as resulting in a problem that a high speed performance of the cache memory is lowered by the operation time necessary for operating the specific means.

SUMMARY OF THE INVENTION

It is therefore an object of the present invention to overcome the above drawbacks and to provide an associative memory device capable of preventing same information from being stored in different addresses of the associative memory device.

It is another object of the present invention to provide an associative memory device in which a detection or determination is made if the same information as that to be written has been stored therein before and if the result of the detection is that the same information has been stored therein, the information to be written is inhibited from being stored while when the same information has not been stored therein, the information to be written is allowed to be stored in a predetermined memory cell, so as not to store the same information into a plurality of different addresses of the memory cells.

One feature of the present invention resides in an associative memory device which comprises: associative memory cells for retrieving an address or addresses in which the same information as the retrieval information has been stored, by the retrieval information; retrieval starting means for applying the retrieval information to the memory cells and for starting the retrieval operation; detecting means for detecting whether or not the same information as the retrieval information has been stored in the memory cells and for producing a same information non-existence signal; and write means for storing write information in a predetermined memory cell among the associative memory cells in accordance with the same information non-existence signal.

These and other objects, features, and advantages of the invention will be better understood from the following description with reference to the accompanying drawings.

DESCRIPTION OF THE PREFERRED EMBODIMENT

Figure 1:
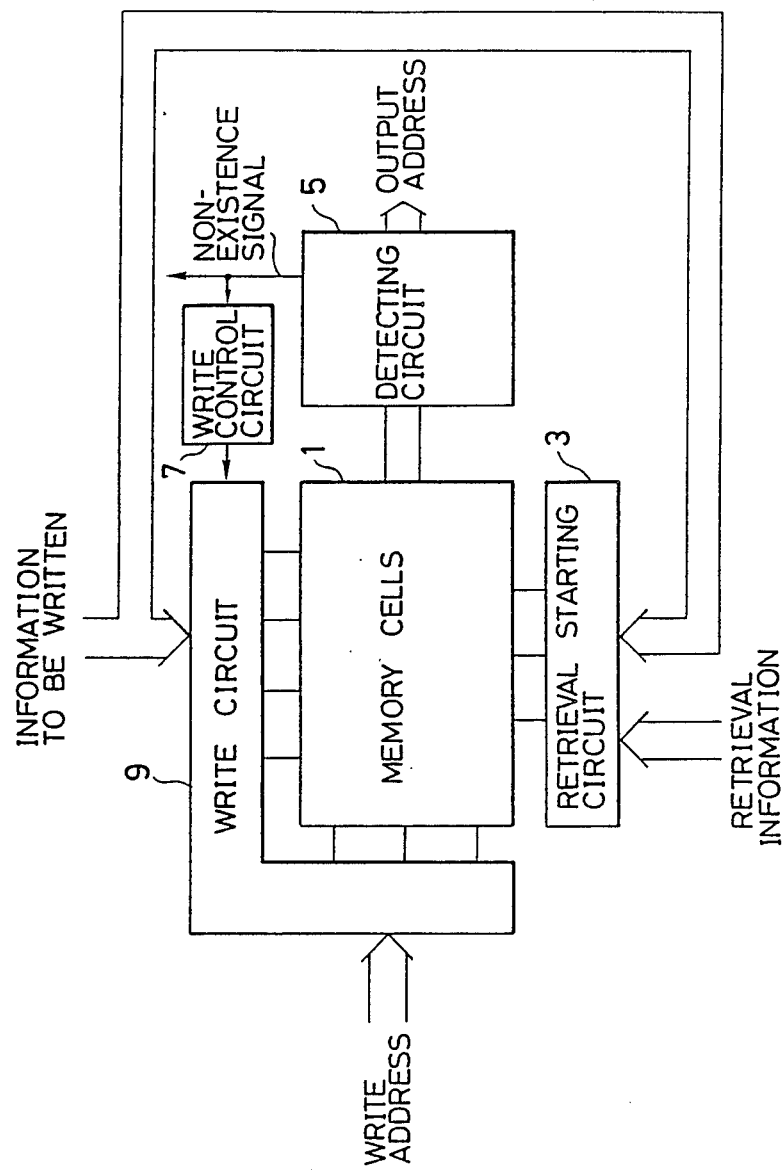
FIG. 1 is a block diagram of an associative memory device according to the present invention.

Referring to FIG. 1, an associative memory device for controlling the output of a cache memory according to the present invention comprises associative memory cells 1, a retrieval starting circuit 3, a detecting circuit 5 for detecting the existence of the same information in different addresses in the associative memory cell, a write control circuit 7, and a write circuit 9.

When a write instruction signal is supplied from the write control circuit 7, information is stored from the write circuit 9 in an address of the memory cells 1, designated by the address to be written. In the retrieval mode, when retrieval information is applied from the retrieval starting circuit 3, the information which coincides with the retrieval information is retrieved and an address or addresses into which the information in question has been stored is determined.

The retrieval starting circuit 3, when retrieval information is applied thereto, supplies the retrieval information to the memory cells 1 after the memory cells 1 are put in a retrieval mode state. On the other hand, when write information is applied to the retrieval starting circuit 3, it supplies the write information to be stored in the memory cells 1 to a certain cell and the retrieval operation of the write information is performed for the memory cells 1 after putting the memory cells 1 in the retrieval mode state. In this operation, if the same information as the information to be retrieved has not been stored in any memory location of the memory cells 1, the detecting circuit 5 for detecting the existence or non-existence of the same information produces a same information non-existence signal which indicates that there is no same information stored therein and it supplies the signal to the write circuit 7 and a memory controller, not shown.

On the other hand, however, when the same information has been stored in a plurality of memory locations of the memory cells 1, the addresses into which the same information has been stored are applied to the cache memory (not shown here).

The write control circuit 7 receives the same information non-existence signal and produces and applies a write acknowledge signal indicative of instructing the write operation of the information to be written by the write circuit 9 to the same. The write circuit 9 stores, when receiving the write acknowledge signal, the information to be written into a predetermined address of the memory cells 1.

The operation of the associative memory device according to the present invention is as follows:

When the information to be written is applied to the retrieval starting circuit 3 and the write circuit 9 in the write mode of the associative memory device, retrieval operation of the information is carried out in the memory cells 1 by the retrieval starting circuit 3. As a result of the retrieval operation, when the same information as the information to be written has not been stored in the memory cells 1, the same information non-existence signal is produced from the detecting circuit 5 and is then applied to the write control circuit 7 and a memory controller (not shown).

The write control circuit 7, after receiving the non-existence signal applies the write acknowledge signal to the write circuit 9, so as to store the information to be written in a predetermined address of the memory cells through the write circuit 9 as well as to store the same in the cache memory by the memory controller which received the same information non-existence signal.

On the other hand, when the same information as that of the information to be written has been stored in the memory cells 1, the non-existence signal is no longer applied to the write control circuit 7 and the write acknowledge signal is no longer applied to the write circuit 9, as well. Accordingly, the write circuit 9 does not perform the write operation, so that the information to be written cannot be stored in the memory cells 1.

In a write mode the information to be written is searched prior to storing the information into the memory cells, the same information is never stored in different addresses of the memory cells 1.

Figure 2:
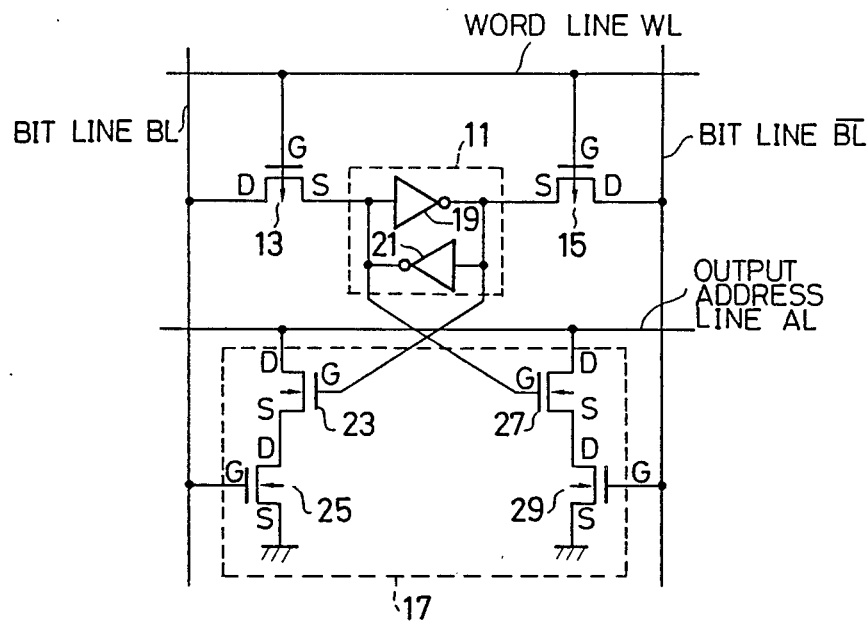
FIG. 2 is one embodiment of the associative memory cell to be used in the device of FIG. 1, according to the present invention.

FIG. 2 shows the construction of a first embodiment of an associative memory cell of the associative memory device according to the present invention. The memory cell is comprised of an information hold circuit 11, transfer gates 13 and 15, a retrieval circuit 17, a word line WL, bit lines BL and $\overline{BL}$, and an output address line AL.

The information hold circuit 11 comprises inverter circuits 19 and 21, with each of the input and output terminals connected to each other. The input terminal of the inverter circuit 19 is connected to the bit line BL through the transfer gate 13 while the output terminal thereof is connected to the bit line $\overline{BL}$ through the transfer gate 15. The information hold circuit 11 is provided so as to store the information applied from the bit line BL as well as its inverted information applied from the bit line $\overline{BL}$ in the write operation.

Furthermore, the information hold circuit 11 functions so as to send the information stored in the hold circuit 11 to the bit lines BL and $\overline{BL}$ through the transfer gates 13 and 15 in the read operation.

P-channel MOS transistors (referred to hereinafter as P-MOS transistors) are used as the transfer gates 13 and 15, with their gate electrodes connected to the word line WL, so as to render them either conductive or non-conductive by a signal applied from the word line WL and to transfer information between the information hold circuit 11 and bit line BL and between the hold circuit 11 and the bit line $\overline{BL}$.

The retrieval circuit 17 is constructed by N-channel MOS transistors, each of which is referred to hereinafter as an N-MOS transistor. The N-MOS transistor 23 is interconnected in such a manner that its gate electrode G is connected to the source electrode S of the transfer gate 15, its drain electrode D is connected to the output address line AL and its source electrode S is connected the drain electrode D of the N-MOS transistor 25. The N-MOS transistor 25 has its gate electrode G connected to the bit line BL and its source electrode S connected to the ground.

The N-MOS transistor 27 is interconnected in such that its gate electrode G is connected to the source electrode S of the transfer gate 13, its drain electrode D is connected to the output address line AL and its source electrode S is connected to the drain electrode D of the N-MOS transistor 29. The N-MOS transistor 29 has its gate electrode G connected to the bit line $\overline{BL}$ and its source electrode connected to the ground.

The actual memory array of the associative memory device is constructed, with each of the memory cells thus constructed arranged in a matrix form and each of the output address lines AL is connected in a wired OR configuration respectively.

Description will now be made about the retrieval operation of the information to be written in the memory cell thus constructed. Before starting the retrieval operation, the bit lines BL and $\overline{BL}$ are precharged to ground levels, i.e., at O V, normally. After this operation, the output address line AL is precharged to the power supply potential $V_{DD}$. Moreover, when, for instance, low level information has been stored in the information hold circuit 11, the gate electrode of the N-MOS transistor 23 is made in the high level condition, and the gate electrode of the N-MOS transistor 27 is put in the low level condition while the N-MOS transistor 23 is in the conductive condition and the N-MOS transistor 23 is in the non-conductive condition.

With the predetermined condition of the bit lines BL and $\overline{BL}$ and the precharged condition of the output address line AL, when the information to be written is applied to the bit line BL and its inverted information is applied to the bit line $\overline{BL}$, the retrieval operation is performed. For instance, when the information having the high level is applied to the bit line BL while the inverted information having the low level is applied to the bit line $\overline{BL}$ is applied, the gate electrode of the N-MOS transistor 25 becomes high while the N-MOS transistor 21 is rendered non-conductive. As a result, current flows in the N-MOS transistors 25 and 23 from the output address line AL, so that the potential of the output address line AL becomes the ground potential.

On the other hand, when low level information is applied to the bit line BL while its inverted information having the high level is applied to the bit line $\overline{BL}$, the gate electrode of the N-MOS transistor 25 becomes the low level condition, while the gate electrode of the N-MOS transistor 29 is rendered non-conductive, with the result that the N-MOS transistor 25 is rendered non-conductive and the N-MOS transistor 29 is rendered conductive, thereby maintaining the potential of the output address line AL at the $V_{DD}$ potential.

Namely, when the information to be written coincides with the stored information in the information hold circuit 11, the potential of the output address line AL is maintained at the potential $V_{DD}$ while when the two information signals do not coincide with each other, the output address line AL becomes the ground potential. Consequently, when the same information as that to be written has been stored in the memory cells, all of the output address lines AL become the ground potential, so that by detecting this condition by a circuit provided outside of the memory cells, a same information non-existence signal which indicates that the same information as that to be written has not been stored in the memory cells is produced from the circuit.

Figure 3:
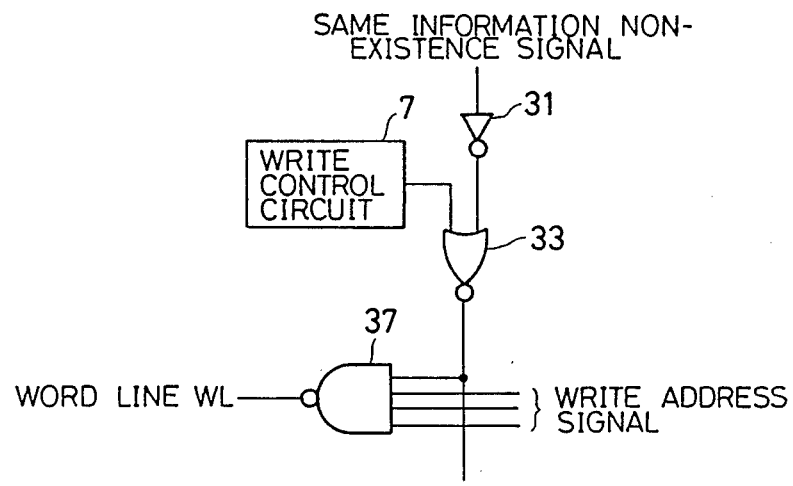
FIG. 3 is one embodiment of a word line control circuit to be used in the associative memory device and the associative memory cells shown in FIGS. 1 and 2.

FIG. 3 shows a word line control circuit for receiving the non-existence signal and for storing the information to be written in a certain memory location of a predetermined memory cell shown in FIG. 2. The word control circuit comprises an inverter 31, a NOR circuit 33 and a NAND circuit 37.

In this circuit, when the information in question has not been stored in the memory cells after terminating the retrieval operation of the information in the write mode, the same information non-existence signal of the high level is applied to one input terminal of the NOR circuit 33 through an inverter circuit 31 while a low level write signal is applied to the other input terminal of the NOR circuit 33 from the write control circuit 35. Then the NOR circuit 33 produces a low level write signal in the write mode operation, thereby producing and supplying a high level output signal to a NAND circuit 37 therefrom. As a result, the NAND circuit 37 receives the high level signal and a write address signal and produces a low level signal therefrom. Accordingly, the word line WL connected to the output terminal of the NAND circuit 37 becomes a low level condition and a particular memory cell which is connected to the word line WL is selected.

In the above condition of the word line WL, the transfer gates 13 and 15, with their gate electrodes connected to the word line, are now rendered conductive. In this condition, when the information to be written and its inverted information are applied to the bit lines BL and $\overline{BL}$ respectively, which have preliminarily been predischarged to the ground potential, they are applied to the information hold circuit 11 through the transfer gates 13 and 15 are stored therein, thus realizing the write operation.

On the other hand, however, when it has been turned out that, after terminating the search operation of the information to be written, the same information as that to be written was not stored in the memory cells, the same information non-existence signal is not produced from the detecting circuit 5 since at least one output address line AL becomes the power supply potential $V_{DD}$. As a result, no write operation is carried out in this case, as there is no word line selected.

Figure 4:
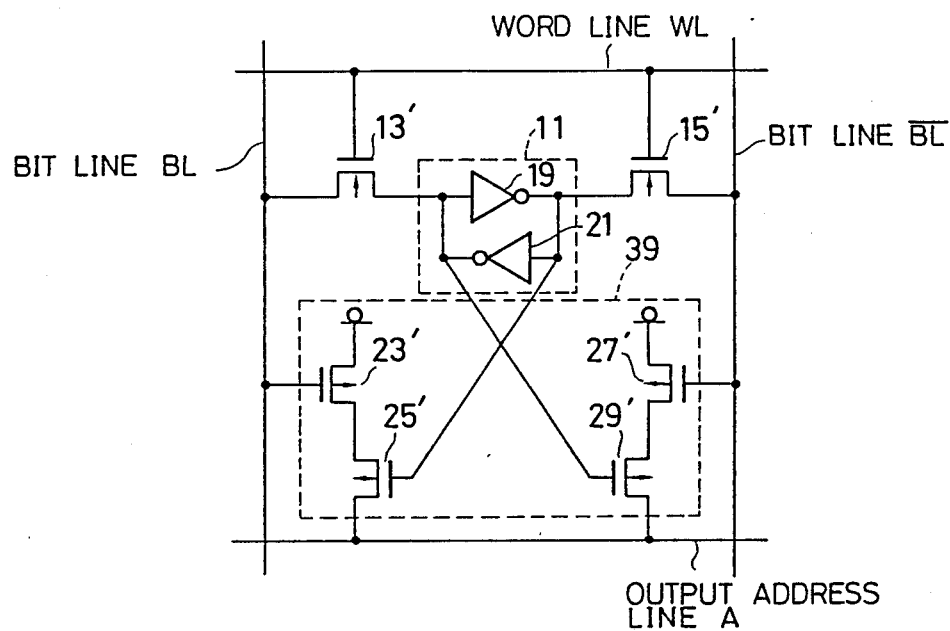
FIG. 4 is another embodiment of the associative memory cell according to the present invention.

FIG. 4 shows another embodiment of the associative memory cell according to the present invention. In this embodiment, the transfer gate circuits are constructed by the N-MOS transistors 13' and 15' while the transistors in the retrieval circuit 39 are constructed by P-MOS transistors 23', 25', 27' and 29'. This associative memory cell operates in the similar manner as that shown in FIG. 2.

Namely, when the information to be written coincides with the stored information in the memory cell, the output address line AL is maintained at the ground potential while when the information does not coincide, the potential of the output address line AL is increased from the ground potential to the power supply potential $V_{DD}$, thereby performing the retrieval operation.

Figure 5:
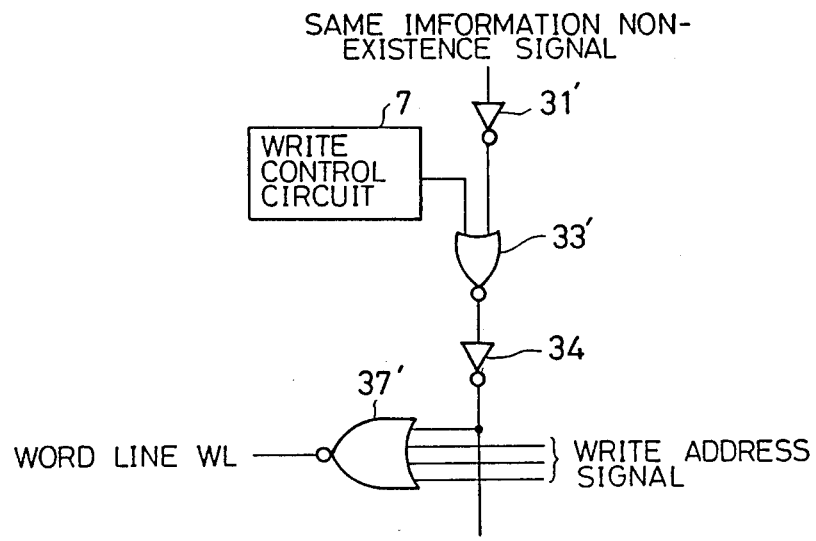
FIG. 5 is another embodiment of the word line control circuit to be used in the memory device of FIGS. 1 and 4.

FIG. 5 shows another word line control circuit for selecting a predetermined word line WL of the memory cells, which is adapted to the memory cell of FIG. 4. In operation, when a write acknowledge signal from the write control circuit 7 (in FIG. 1) as well as the same information non-existence signal is received by the word line control circuit of FIG. 5 in the write mode, a predetermined word line WL is selected, so as to render the transfer gate circuits 13' and 15' having its gate electrode connected to the word lines respectively, conductive by supplying a high level signal to the word line WL.

In the embodiments according to the present invention shown in FIGS. 1 through 3, there might be a case that the write operation is delayed because of carrying out the search operation of the information to be written, prior to the write operation. However, since the write operation for the associative memory device is carried out only when transferring the information from the memory cells to the cache memory, the frequency of producing the delay is normally small, so that only the access time of the low speed main memory becomes a predominating factor and there will be no problems affecting the associative memory device.

As described in the foregoing embodiments, in the associative memory device according to the present invention, a determination is made whether or not same information as the information to be written into an memory cell has been stored in the memory cells of the associative memory before storing the information in the cell in the write operation. When the same information has been stored therein, the information to be written is inhibited from being stored while when the same information has not been stored therein, the information to be written is allowed to be stored in a predetermined memory cell, so as not to store the same information into a plurality of different addresses of the memory cells. As a result, in the write operation of information, no particular means for dealing with the case where a plurality of same information are produced is required, as well as obviating any additional time necessary for that operation.

Accordingly, in the associative memory device according to the present invention, the same information can be prevented from being produced from a plurality of different addresses of the associative memory, without delaying the access time to the memory.

While the invention has been described in its preferred embodiments, it is to be understood that the words which have been used are words of description rather than limitation and that various changes and modifications may be made within the purview of the appended claims without departing from the true scope and spirit of the invention in its broader aspects.

What is claimed is:

1. An associative memory device which comprises:
   associative memory cells for storing addresses in which information corresponding to retrieval information has possibly been stored;
   retrieval means for applying said retrieval information to said memory cells and retrieving said addresses;
   detecting means for detecting whether or not the same information corresponding to the retrieval information has been stored and for producing a same information non-existence signal if the same information has not been stored;
   write control circuit means responsive to said non-existence signal for producing a write acknowledge signal;
   writing means for storing write information into a predetermined memory cell among the associative memory cells in accordance with said write acknowledge signal produced by said write control circuit means; and
   a word line control circuit having a NOR circuit, one input terminal of which is connected to said write control means and another input terminal of which is connected to receive the same information non-existence signal through an inverter, and a NAND circuit having a plurality of input terminals, one of which is connected to the output terminal of said NOR circuit so as to control a word line.

2. An associative memory device which comprises:
   associative memory cells for storing addresses in which the information corresponding to retrieval information has possibly been stored;
   retrieval means for applying said retrieval information to said memory cells to retrieve said addresses;
   detecting means for detecting whether or not the same information corresponding to the retrieval information has been stored and for producing a same information non-existence signal if the same information has not been stored;
   write control circuit means responsive to said non-existence signal for producing a write acknowledge signal;
   writing means for storing write information into a predetermined memory cell among the associative memory cells in accordance with said write acknowledge signal produced by said write control circuit means; and
   a word line control circuit having a NOR circuit, one input terminal of which is connected to receive the same information non-existence signal through an inverter and another input terminal of which is connected to said write control means, and a NAND circuit having a plurality of input terminals, one of which input terminals is connected to the output terminal of said NOR circuit through a second inverter.

3. A circuit for driving an associative memory comprising:
   a retrieval circuit for driving said associative memory in its associative mode in order to search for a word to be written in said associative memory and outputting a match/no-match signal dependent on whether a match or no match for said word is found;
   a detecting circuit for signaling whether a match occurs or not on the basis of the match/no-match signal outputted from said associative memory;
   a write-in circuit for writing said word in said associative memory;
   a write-in control circuit for inhibiting write-in operation of said write-in circuit when said detecting circuit signals the existence of a word stored in said associative memory which is matched with said word to be written into said associative memory; and
   a word line control circuit having a NOR circuit, one input terminal of which is connected to said write-in control circuit and another input terminal of which is connected to receive the no-match signal through an inverter, and a NAND circuit having a plurality of input terminals, one of which is connected to the output terminal of said NOR circuit so as to control a word line.

4. A circuit for driving an associative memory comprising:
   a retrieval circuit for driving said associative memory in its associative mode in order to search for a word to be written in said associative memory and outputting a match/no-match signal dependent on whether a match or no match for said word is found;
   a detecting circuit for signaling whether a match occurs or not on the basis of the match/no-match signal outputted from said associative memory;
   a write-in circuit for writing said word in said associative memory;
   a write-in control circuit for inhibiting write-in operation of said write-in circuit when said detecting circuit signals the existence of a word stored in said associative memory which is matched with said word to be written into said associative memory; and
   a word line control circuit having a NOR circuit, one input terminal of which is connected to receive the no-match signal through an inverter and another input terminal of which is connected to said write-in control circuit, and a NAND circuit having a plurality of input terminals, one of which input terminals is connected to the output terminal of said NOR circuit through a second inverter.

* * * * *